US010062765B2

(12) United States Patent
Oh et al.

(10) Patent No.: US 10,062,765 B2
(45) Date of Patent: Aug. 28, 2018

(54) NONVOLATILE MEMORY DEVICE INCLUDING MULTIPLE PLANES

(71) Applicant: SK hynix Inc., Gyeonggi-do (KR)

(72) Inventors: Sung-Lae Oh, Chungcheongbuk-do (KR); Dong-Hyuk Kim, Seoul (KR); Soo-Nam Jung, Seoul (KR); Je-Hyun Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/651,058

(22) Filed: Jul. 17, 2017

(65) Prior Publication Data

US 2018/0197967 A1    Jul. 12, 2018

(30) Foreign Application Priority Data

Jan. 10, 2017    (KR) ........................ 10-2017-0003436

(51) Int. Cl.
| | |
|---|---|
| *G11C 8/00* | (2006.01) |
| *H01L 29/51* | (2006.01) |
| *H01L 27/115* | (2017.01) |
| *G11C 5/02* | (2006.01) |
| *G11C 16/04* | (2006.01) |
| *H01L 27/12* | (2006.01) |

(52) U.S. Cl.
CPC ............ *H01L 29/517* (2013.01); *G11C 5/025* (2013.01); *G11C 16/0475* (2013.01); *H01L 27/115* (2013.01); *H01L 27/12* (2013.01); *H01L 29/513* (2013.01); *H01L 29/518* (2013.01)

(58) Field of Classification Search
CPC ..... G11C 16/0483; G11C 16/06; G11C 5/025; G11C 5/06; G11C 16/10; G11C 16/24; G11C 16/26; G11C 5/063; G11C 13/0069; G11C 16/30; G11C 7/18; G11C 11/5642; G11C 11/5671; G11C 16/0458; G11C 16/14; G11C 2213/71
USPC .... 365/148, 185.17, 185.05, 185.18, 185.27, 365/63, 163, 185.26, 100, 158, 171, 173, 365/185.03, 185.2, 189.011, 46, 55, 72, 365/97
See application file for complete search history.

(56) References Cited

U.S. PATENT DOCUMENTS

2015/0035065 A1* 2/2015 Park ...................... H01L 27/105
 257/368
2015/0303209 A1 10/2015 Park et al.

FOREIGN PATENT DOCUMENTS

KR    1020160069903    6/2016

* cited by examiner

*Primary Examiner* — Thong Q Le
(74) *Attorney, Agent, or Firm* — IP & T Group LLP

(57) ABSTRACT

A nonvolatile memory device includes bit lines arranged in a first direction over a substrate; a memory cell array disposed between the substrate and the bit lines, and including a plurality of planes which are arranged in a second direction perpendicular to the first direction; page buffer circuits disposed between the substrate and the memory cell array; contact pads disposed between the substrate and the memory cell array, the contact pads being suitable for electrically coupling the bit lines and the page buffer circuits; and routing lines disposed at the same layer as the contact pads, and extending in the second direction, wherein the contact pads are disposed to overlap with at least two lines which are arranged in the second direction, and the routing lines are formed in a bent pattern to pass between the contact pads which are disposed to overlap with different lines.

20 Claims, 11 Drawing Sheets

US 10,062,765 B2

NONVOLATILE MEMORY DEVICE INCLUDING MULTIPLE PLANES

CROSS-REFERENCE TO RELATED APPLICATION

The present application claims priority to Korean Patent Application No. 10-2017-0003436 filed in the Korean Intellectual Property Office on Jan. 10, 2017, which is incorporated herein by reference in its entirety.

BACKGROUND

1. Technical Field

Various embodiments generally relate to a semiconductor memory device, and, more particularly, to a nonvolatile memory device including multiple planes.

2. Related Art

A semiconductor memory device is a memory device which is realized using a semiconductor such as silicon (Si), germanium (Ge), gallium arsenide (GaAs) and indium phosphide (InP). A semiconductor memory device may generally be classified as a volatile memory device or a nonvolatile memory device.

A volatile memory device is a memory device in which stored data is removed when power supply is interrupted. Examples of a volatile memory device include an SRAM (static random access memory), a DRAM (dynamic RAM), and an SDRAM (synchronous DRAM). A nonvolatile memory device is a memory device which retains data stored therein even when power supply is interrupted. Examples of a nonvolatile memory device include a ROM (read only memory), a PROM (programmable ROM), an EPROM (electrically programmable ROM), an EEPROM (electrically erasable and programmable ROM), a FLASH memory, a PRAM (phase change RAM), an MRAM (magnetic RAM), an RRAM (resistive RAM), and an FRAM (ferroelectric RAM).

SUMMARY

In an embodiment, a nonvolatile memory device may include: a plurality of bit lines arranged in a first direction over a substrate; a memory cell array disposed between the substrate and the bit lines, and including a plurality of planes which are arranged in a second direction perpendicular to the first direction; page buffer circuits disposed between the substrate and the memory cell array; contact pads disposed between the substrate and the memory cell array, the contact pads being suitable for electrically coupling the bit lines and the page buffer circuits; and routing lines disposed at the same layer as the contact pads, and extending in the second direction, wherein the contact pads are disposed to overlap with at least two lines which are arranged in the second direction, and the routing lines are formed in a bent pattern to pass between the contact pads which are disposed to overlap with different lines.

In an embodiment, a nonvolatile memory device may include: a plurality of bit lines arranged in a first direction over a substrate; a memory cell array disposed between the substrate and the bit lines, and including a plurality of cell gate lines and a plurality of dielectric lines which are arranged in a second direction perpendicular to the first direction; a page buffer circuit disposed between the substrate and the memory cell array; contact pads disposed between the page buffer circuit and the memory cell array, and suitable for electrically coupling the page buffer circuit and the bit lines; and routing lines disposed at the same layer as the contact pads, and extending in the second direction, wherein the contact pads are disposed to overlap with at least two of the dielectric lines, and the routing lines are formed in a bent pattern to pass between the contact pads which overlap with different dielectric lines.

In an embodiment, a nonvolatile memory device may include: a plurality of bit lines arranged in a first direction over a substrate; a memory cell array disposed between the substrate and the bit lines, and including a plurality of planes which are arranged in the first direction and a second direction perpendicular to the first direction; page buffer circuits disposed between the substrate and the memory cell array; contact pads disposed between the page buffer circuits and the memory cell array, and suitable for electrically coupling the bit lines and the page buffer circuits; and routing lines disposed at the same layer as the contact pads, and extending in the second direction, wherein the contact pads are disposed to overlap with at least two lines which are arranged in the second direction, and the routing lines are formed in a bent pattern to pass between the contact pads which are disposed to overlap with different lines.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
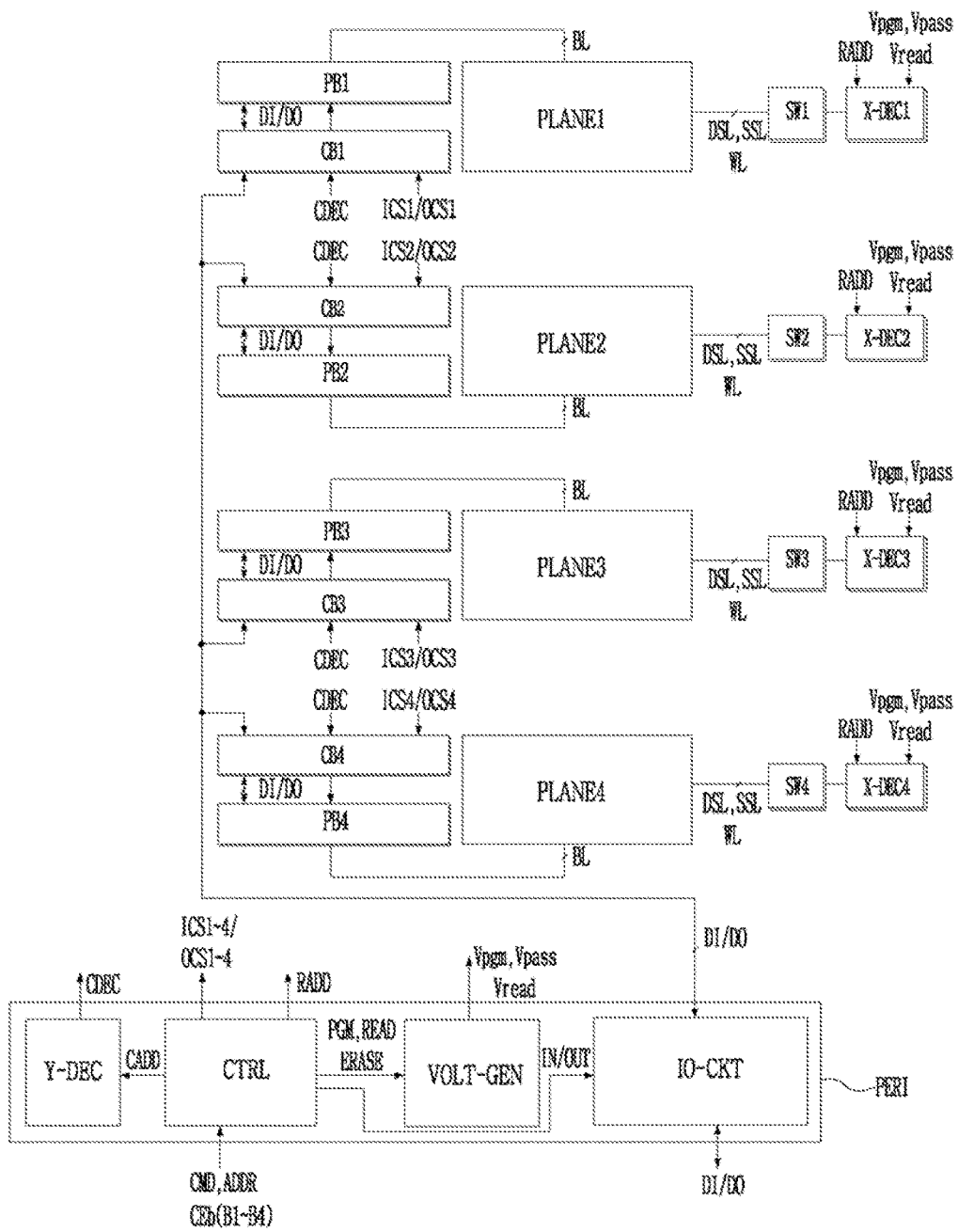
FIG. 1 is a block diagram illustrating a nonvolatile memory device in accordance with an embodiment of the invention.

Hereinafter, a nonvolatile memory device including multiple planes will be described below with reference to the accompanying drawings through various examples of embodiments. Example embodiments will be described in more detail with reference to the accompanying drawings. The present disclosure, however, may be embodied in various different forms, and should not be construed as being limited to the illustrated embodiments herein. Rather, these embodiments are provided as examples so that this disclosure will be thorough and complete, and will fully convey the various aspects and features of the present invention to those skilled in the art.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "Including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a nonvolatile memory device in accordance with an embodiment.

Referring to FIG. 1, the nonvolatile memory device, may include a memory cell array including a plurality of planes PLANE1 to PLANE4, row decoders X-DEC1 to X-DEC4, switch circuits SW1 to SW4, page buffer circuits PB1 to PB4, cache buffers CB1 to CB4, and a peripheral circuit PERI. The peripheral circuit PERI may include a control logic CTRL, a voltage generator VOLT-GEN, an input/output circuit IO-CKT, and a column decoder Y-DEC.

The memory cell array as illustrated in FIG. 1 includes four planes PLANE1 to PLANE4 in which data are stored. However, we note that this is an example, and that more or less planes may be used. The four planes include a first plane PLANE1, a second plane PLANE2, a third plane PLANE3, and a fourth plane PLANE4. The first to fourth planes PLANE1 to PLANE4 may be substantially identical to one another.

Figure 2:
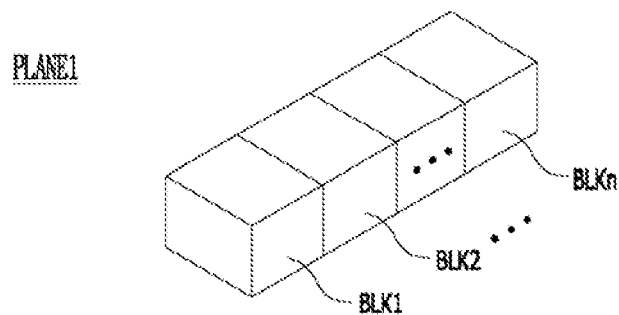
FIG. 2 is a block configuration diagram illustrating one plane among the planes shown in FIG. 1.
Figure 3:
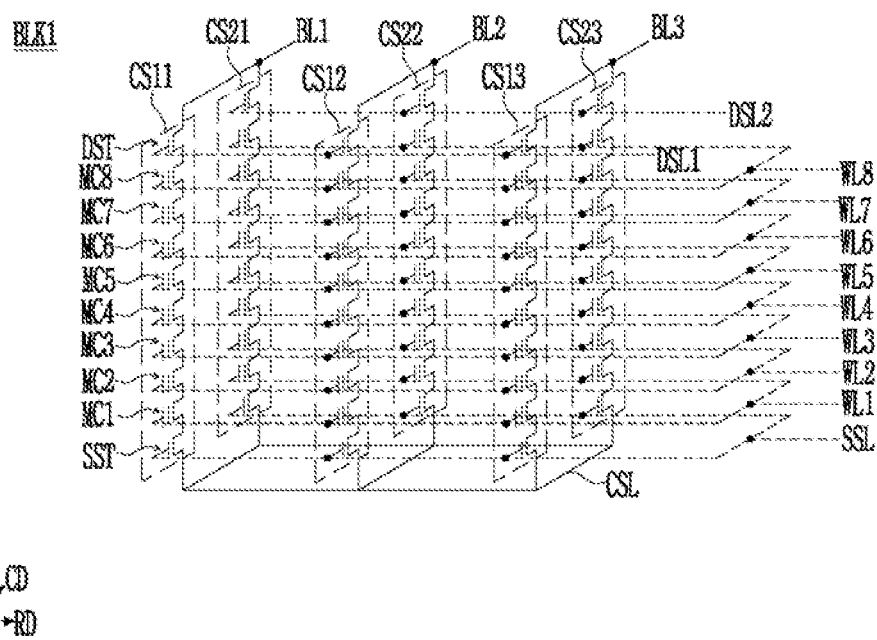
FIG. 3 is an equivalent circuit diagram illustrating one memory block among the memory blocks shown in FIG. 2.

FIG. 2 is a block configuration diagram illustrating one plane PLANE1 among the planes shown in FIG. 1, and FIG. 3 is an equivalent circuit diagram illustrating one memory block BLK1 among the memory blocks shown in FIG. 2.

Since the planes PLANE1 to PLANE4 are substantially identical, descriptions will be made below for only the first plane PLANE1, for the sake of convenience in explanation.

Referring to FIG. 2, the first plane PLANE1 may include a plurality of memory blocks BLK1 to BLKn. Since the memory blocks BLK1 to BLKn are configured the same as one another, descriptions will be made for only a first memory block BLK1, for the sake of convenience in explanation.

Referring to FIG. 3, the first memory block BLK1 may include a plurality of cell strings CS11, CS21, CS12, CS22, CS13 and CS23 (CS11 to CS23) which extend in a third direction VD and are provided in the first direction RD and the second direction CD. The second direction CD may be orthogonal to the first direction RD on the same plane. The third direction VD may be orthogonal to the plane defined by the first direction RD and the second direction CD.

The cell strings CS11 to CS23 are respectively coupled between bit lines BL1, BL2 and BL3 associated therewith and a common source line CSL, and are configured the same as one another. Each of the cell strings CS11 to CS23 may include at least one source select transistor SST which is coupled to the common source line CSL, at least one drain select transistor DST which is coupled to a bit line BL, and a plurality of memory cells MC1 to MC8 which are coupled between the source select transistor SST and the drain select transistor DST. The gate of the source select transistor SST may be coupled to a source select line SSL. The gate of the drain select transistor DST may be coupled to a drain select line DSL1 or DSL2. The gates of the memory cells MC1 to MC8 may be coupled to corresponding word lines WL1 to WL8, respectively.

A set of memory cells which are coupled to the same word line and are programmed together is referred to as a page. The first memory block BLK1 may be configured by a plurality of pages. Also, a plurality of pages may be coupled to each word line. In the embodiment illustrated in FIG. 3, each word line is coupled in common to two pages at the same height.

Referring again to FIG. 1, each of the first to fourth planes PLANE1 to PLANE4 may be electrically coupled to each of the row decoders X-DEC1 to X-DEC4 through word lines WL, at least one drain select line DSL and at least one source select line SSL. Each of the first to fourth planes PLANE1 to PLANE4 may be electrically coupled to each of the page buffer circuits PB1 to PB4 through bit lines BL.

The row decoders X-DEC1 to X-DEC4 may include first to fourth row decoders X-DEC1 to X-DEC4 which correspond to the first to fourth planes PLANE1 to PLANE4, respectively.

The first to fourth row decoders X-DEC1 to X-DEC4 may select any one among the memory blocks of the first to fourth planes PLANE1 to PLANE4 in response to a row address RADD from the control logic CTRL. The first to fourth row decoders X-DEC1 to X-DEC4 may transfer operation voltages Vpgm, Vpass and Vread from the voltage generator VOLT-GEN to the word lines WL and the select lines DSL and SSL coupled to a selected memory block.

The first to fourth row decoders X-DEC1 to X-DEC4 may be electrically coupled to the word lines WL and the select lines DSL and SSL coupled to the corresponding planes PLANE1 to PLANE4 through the switch circuits SW1 to SW4.

The switch circuits SW1 to SW4 may include first to fourth switch circuits SW1 to SW4 corresponding to the first to fourth planes PLANE1 to PLANE4, respectively. Each of the first to fourth switch circuits SW1 to SW4 may include a plurality of pass transistors. Each of the first to fourth switch circuits SW1 to SW4 may be electrically coupled to each plane through word lines WL and select lines DSL and SSL.

The page buffer circuits PB1 to PB4 may include first to fourth page buffer circuits PB1 to PB4 corresponding to the first to fourth planes PLANE1 to PLANE4, respectively. Each of the first to fourth page buffer circuits PB1 to PB4 may be electrically coupled to a corresponding plane through bit lines BL.

The cache buffers CB1 to CB4 may include first to fourth cache buffers CB1 to CB4 corresponding to the first to fourth planes PLANE1 to PLANE4, respectively.

Each of the first to fourth page buffer circuits PB1 to P4 may be electrically coupled to a cache buffer corresponding to the same plane therewith. Each of the first to fourth page buffer circuits PB1 to PB4 may latch input data DI provided from the cache buffer, or select some or the whole of the bit lines BL of a corresponding plane in response to a column decoding signal CDEC from the column decoder Y-DEC and latch output data DO provided from the selected bit lines. Each of the first to fourth page buffer circuits PB1 to PB4 may select some or all of the bit lines BL of a corresponding plane in response to the column decoding signal CDEC, and output latched data to the selected bit lines or output latched data to the cache buffer corresponding to the same plane therewith.

The first to fourth cache buffers CB1 to CB4 may store respective input data DI provided through the input/output circuit IO-CKT or store respective output data DO provided from the first to fourth page buffer circuits PB1 to PB4 in response to cache input control signals ICS1 to ICS4 from the control logic CTRL. When the cache input control signals ICS1 to ICS4 are enabled, the first to fourth cache buffers CB1 to CB4 may store the respective input data DI or the respective output data DO.

The first to fourth cache buffers CB1 to CB4 may provide the first to fourth page buffer circuits PB1 to PB4 or the input/output circuit IO-CKT with the data DI or DO respectively stored therein in response to cache output control signals OCS1 to OCS4 from the control logic CTRL. When the cache output control signals OCS1 to OCS4 are enabled, the first to fourth cache buffers CB1 to CB4 may output the data DI or DO respectively stored therein.

The control logic CTRL may output a program operation signal PGM, a read operation signal READ or an erase operation signal ERASE in response to a command signal CMD. The control logic CTRL may output the cache input control signals ICS1 to ICS4 and the cache output control signals OCS1 to OCS4 in response to the command signal CMD and bits B1 to B4 of a chip enable signal CEb. Moreover, the control logic CTRL may output the row address RADD and a column address CADD in response to an address signal ADD. By the row address RADD, one plane among the first to fourth planes PLANE1 to PLANE4 included in the memory cell array may be selected, one memory block among the plurality of memory blocks included in the selected plane may be selected, and one page among the plurality of pages included in the selected memory block may be selected.

The voltage generator VOLT-GEN may output the operation voltages Vpgm, Vpass and Vread for programming, reading or erasing memory cells in response to the operation signals PGM, READ and ERASE from the control logic CTRL.

In response to an input/output signal IN/OUT outputted from the control logic CTRL, the input/output circuit IO-CKT may transfer the input data DI to the first to fourth cache buffers CB1 to CB4 in a program operation, and provide an exterior with the output data DO transferred from the first to fourth cache buffers CB1 to CB4 in a read operation.

The column decoder Y-DEC may generate the column decoding signal CDEC by decoding the column address signal CADD from the control logic CTRL, and transfer the column decoding signal CDEC to the first to fourth page buffer circuits PB1 to PB4 through the first to fourth cache buffers CB1 to CB4.

Figure 4:
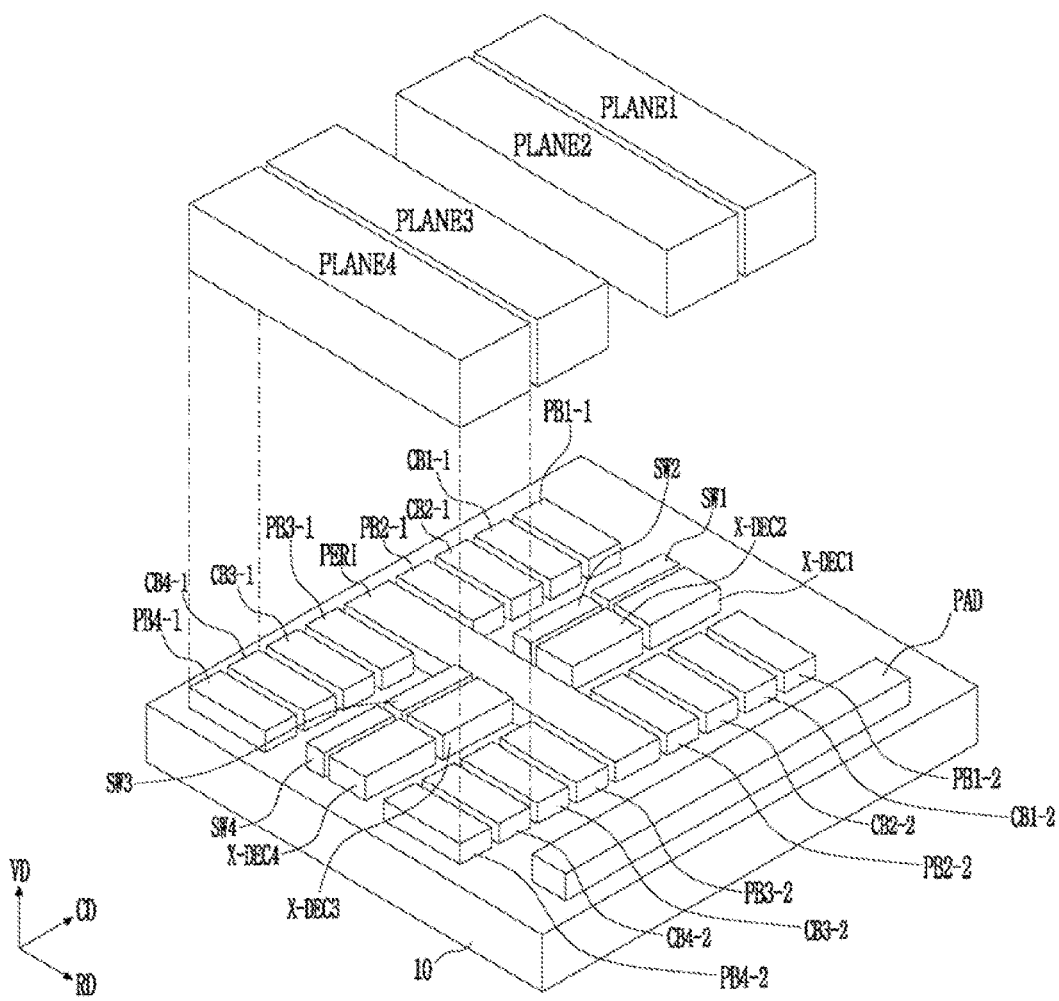
FIG. 4 is a perspective view illustrating a nonvolatile memory device in accordance with an embodiment of the invention.
Figure 5:
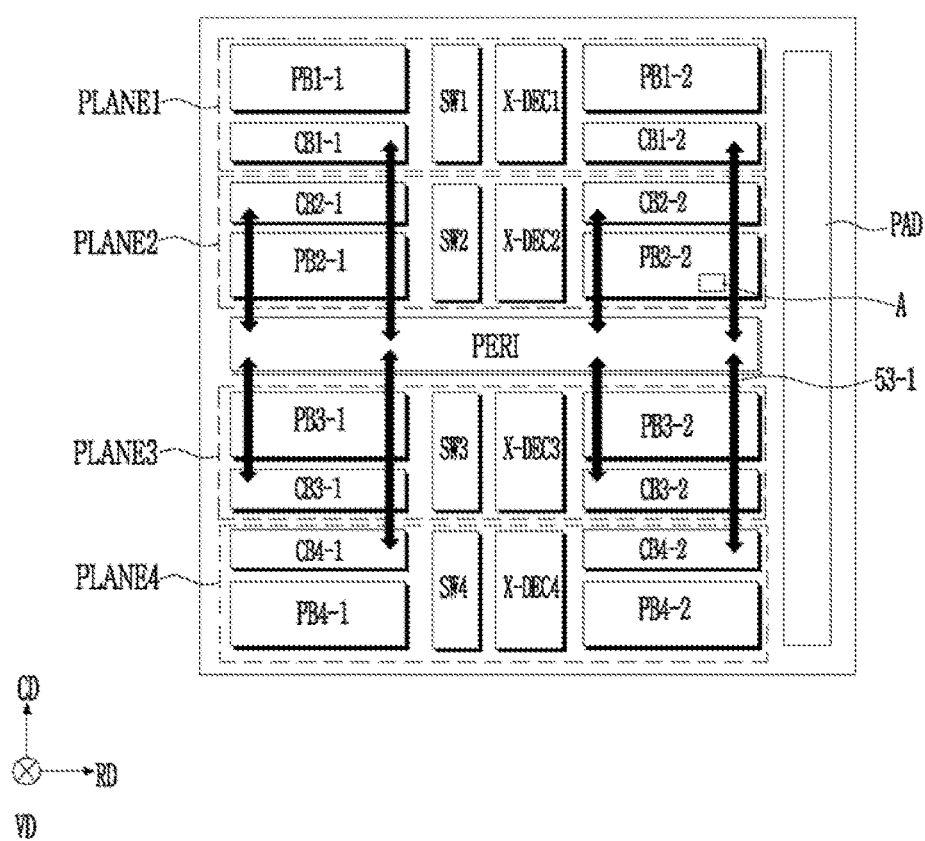
FIG. 5 is a plan view illustrating the nonvolatile memory device of FIG. 4.

FIG. 4 is a perspective view illustrating a nonvolatile memory device in accordance with an embodiment, and FIG. 5 is a plan view illustrating the nonvolatile memory device of FIG. 5.

Referring to FIGS. 4 and 5, the memory cell array PLANE1 to PLANE4 may be disposed over a substrate 10. Between the substrate 10 and the memory cell array PLANE1 to PLANE4, there may be disposed row decoders X-DEC1 to X-DEC4, switch circuits SW1 to SW4, page buffer circuits PB1-1 to PB4-2, cache buffers CB1-1 to CB4-2, and a peripheral circuit PERI. While not shown, a plurality of bit lines may be disposed over the memory cell array PLANE1 to PLANE4.

The memory cell array PLANE1 to PLANE4 may include a plurality of planes, for example, first to fourth planes PLANE1 to PLANE4, which are spaced apart along the second direction CD.

The row decoders X-DEC1 to X-DEC4 may include first to fourth row decoders X-DEC1 to X-DEC4 which correspond to the first to fourth planes PLANE1 to PLANE4, respectively.

The switch circuits SW1 to SW4 may include first to fourth switch circuits SW1 to SW4 corresponding to the first to fourth planes PLANE1 to PLANE4, respectively.

The first to fourth row decoders X-DEC1 to X-DEC4 may be electrically coupled to the corresponding planes PLANE1 to PLANE4 through the corresponding switch circuits SW1 to SW4. The first to fourth row decoders X-DEC1 to X-DEC4 may be disposed respectively adjacent to the switch circuits SW1 to SW4 corresponding to the same planes therewith, in a first direction RD.

The page buffer circuits PB1-1 to PB4-2 may include a first page buffer circuit PB1-1 and PB1-2 corresponding to the first plane PLANE1, a second page buffer circuit PB2-1 and P82-2 corresponding to the second plane PLANE2, a third page buffer circuit PB3-1 and PB3-2 corresponding to the third plane PLANE3, and a fourth page buffer circuit PB4-1 and PB4-2 corresponding to the fourth plane PLANE4.

Each of the first to fourth page buffer circuits PB1-1 to PB4-2 may be physically divided into two sub-page buffer circuits. For example, the first page buffer circuit PB1-1 and PB1-2 may be divided into a first sub-page buffer circuit PB1-1 and a second sub-page buffer circuit PB1-2.

The two sub-page buffer circuits included in each of the first to fourth page buffer circuits PB1-1 to PB4-2 may be disposed adjacent to each other in the first direction RD, with a row decoder and a switch circuit, which correspond to the same plane therewith, interposed therebetween.

While not shown, each of the first to fourth page buffer circuits PB1-1 to PB4-2 may be electrically coupled to a corresponding plane through bit lines (not shown).

The cache buffers CB1-1 to CB4-2 may include a first cache buffer CB1-1 and CB1-2 corresponding to the first plane PLANE1, a second cache buffer CB2-1 and CB2-2 corresponding to the second plane PLANE2, a third cache buffer CB3-1 and CB3-2 corresponding to the third plane PLANE3, and a fourth cache buffer CB4-1 and CB4-2 corresponding to the fourth plane PLANE4.

Each of the first to fourth cache buffers CB1-1 to CB4-2 may be electrically coupled with a page buffer circuit corresponding to the same plane therewith.

Each of the first to fourth cache buffers CB1-1 to CB4-2 may be disposed adjacent to a page buffer circuit corresponding to the same plane therewith, in the second direction CD.

Similarly to the first to fourth page buffer circuits PB1-1 to PB4-2, each of the first to fourth cache buffers CB1-1 to CB4-2 may physically divided into two sub-cache buffers. For example, the first cache buffer CB1-1 and CB1-2 may be physically divided into a first sub-cache buffer CB1-1 and a second sub-cache buffer CB1-2.

The two sub-cache buffers included in each of the first to fourth cache buffers CB1-1 to CB4-2 may be disposed adjacent to each other in the first direction RD, with a row decoder and a switch circuit, which correspond to the same plane therewith, interposed therebetween.

The peripheral circuit PERI may be disposed on the substrate 10 and may have an elongated rectangular form extending in the first direction RD. The length of the peripheral circuit PERI in the first direction RD may be coextensive to the length of the planes in the first direction RD.

The first to fourth page buffer circuits PB1-1 to PB4-2, the first to fourth cache buffers CB1-1 to CB4-2 and the peripheral circuit PERI may be arranged along the second direction CD.

Between the first to fourth cache buffers CB1-1 to CB4-2 and the peripheral circuit PERI, there may be disposed at least one page buffer circuit. For example, the second page buffer circuit PB2-1 and PB2-2 may be disposed between the first and second cache buffers CB1-1, CB1-2, CB2-1 and CB2-2 and the peripheral circuit PERI, and the third page buffer circuit PB3-1 and PB3-2 may be disposed between the third and fourth cache buffers CB3-1, CB3-2, CB4-1 and CB4-2 and the peripheral circuit PERI.

The first to fourth cache buffers CB1-1 to CB4-2 and the peripheral circuit PERI may be electrically coupled through a plurality of routing lines 53-1.

The routing lines 53-1 may include a plurality of data lines which electrically couple the first to fourth cache buffers CB1-1 to CB4-2 and the input/output circuit IO-CKT of the peripheral circuit PERI. In a program operation, the input data DI may be transferred from the input/output circuit IO-CKT to the first to fourth cache buffers CB1-1 to CB4-2 through the data lines. In a read operation, the output data DO may be transferred from the first to fourth cache buffers CB1-1 to CB4-2 to the input/output circuit IO-CKT through the data lines.

The routing lines 53-1 may include a plurality of cache input/output control signal lines which electrically couple the first to fourth cache buffers CB1-1 to CB4-2 and the control logic CTRL of the peripheral circuit PERI. Cache input/output control signals ICS1 to ICS4 and OCS1 to OCS4 provided from the control logic CTRL may be transferred to the first to fourth cache buffers CB1-1 to CB4-2 through the cache input/output control signal lines.

The routing lines 53-1 may include column decoding signal lines which electrically couple the first to fourth cache buffers CB1-1 to CB4-2 and the column decoder Y-DEC of the peripheral circuit PERI. The column decoding signal CDEC outputted from the column decoder Y-DEC may be transferred to the first to fourth cache buffers CB1-1 to CB4-2 through the column decoding signal lines.

The routing lines 53-1 may be disposed between a bottom layer in which the first to fourth page buffer circuits PB1-1 to PB4-2, the first to fourth cache buffers CB1-1 to CB4-2 and the peripheral circuit PERI are positioned and a top layer in which the memory cell array PLANE1 to PLANE4 is positioned.

The routing lines 53-1 may extend from the peripheral circuit PERI to the first to fourth cache buffers CB1-1 to CB4-2 in the second direction CD, and electrically couple the first to fourth cache buffers CB1-1 to CB4-2 and the peripheral circuit PERI. As described above, since the second and third page buffer circuits PB2-1, PB2-2, PB3-1 and PB3-2 are disposed between the first to fourth cache buffers CB1-1 to CB4-2 and the peripheral circuit PERI, the routing lines 53-1 may overlap with the second and third page buffer circuits PB2-1, PB2-2, PB3-1 and PB3-2.

Each of the first to fourth planes PLANE1 to PLANE4 may be disposed over a row decoder, a page buffer circuit, a cache buffer and a switch circuit corresponding thereto. In detail, the first plane PLANE1 may be disposed over the first row decoder X-DEC1, the first switch circuit SW1, the first page buffer circuit PB1-1 and P81-2, and the first cache buffer CB1-1 and CB1-2. The second plane PLANE2 may be disposed over the second row decoder X-DEC2, the second switch circuit SW2, the second page buffer circuit PB2-1 and PB2-2, and the second cache buffer CB2-1 and CB2-2. The third plane PLANE3 may be disposed over the third row decoder X-DEC3, the third switch circuit SW3, the third page buffer circuit PB3-1 and P83-2, and the third cache buffer CB3-1 and CB3-2. The fourth plane PLANE4 may be disposed over the fourth row decoder X-DEC4, the fourth switch circuit SW4, the fourth page buffer circuit PB4-1 and PB4-2, and the fourth cache buffer CB4-1 and CB4-2.

Input/output pads PAD may be disposed in the second direction CD on one side of the first to fourth planes PLANE1 to PLANE4. While not shown, the input/output pads PAD may be electrically coupled with the peripheral circuit PERI through a plurality of wiring lines.

Figure 6:
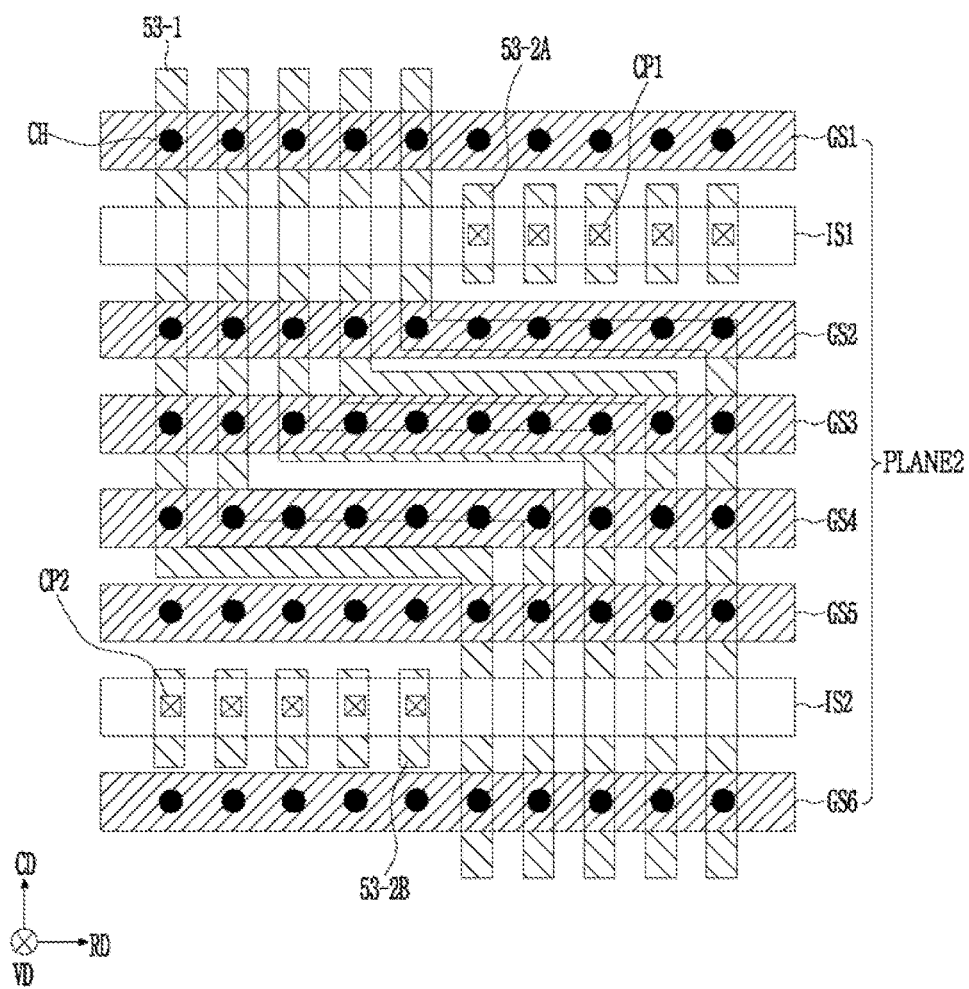
FIGS. 6 and 7 are plan views illustrating a portion A of FIG. 5.
Figure 7:
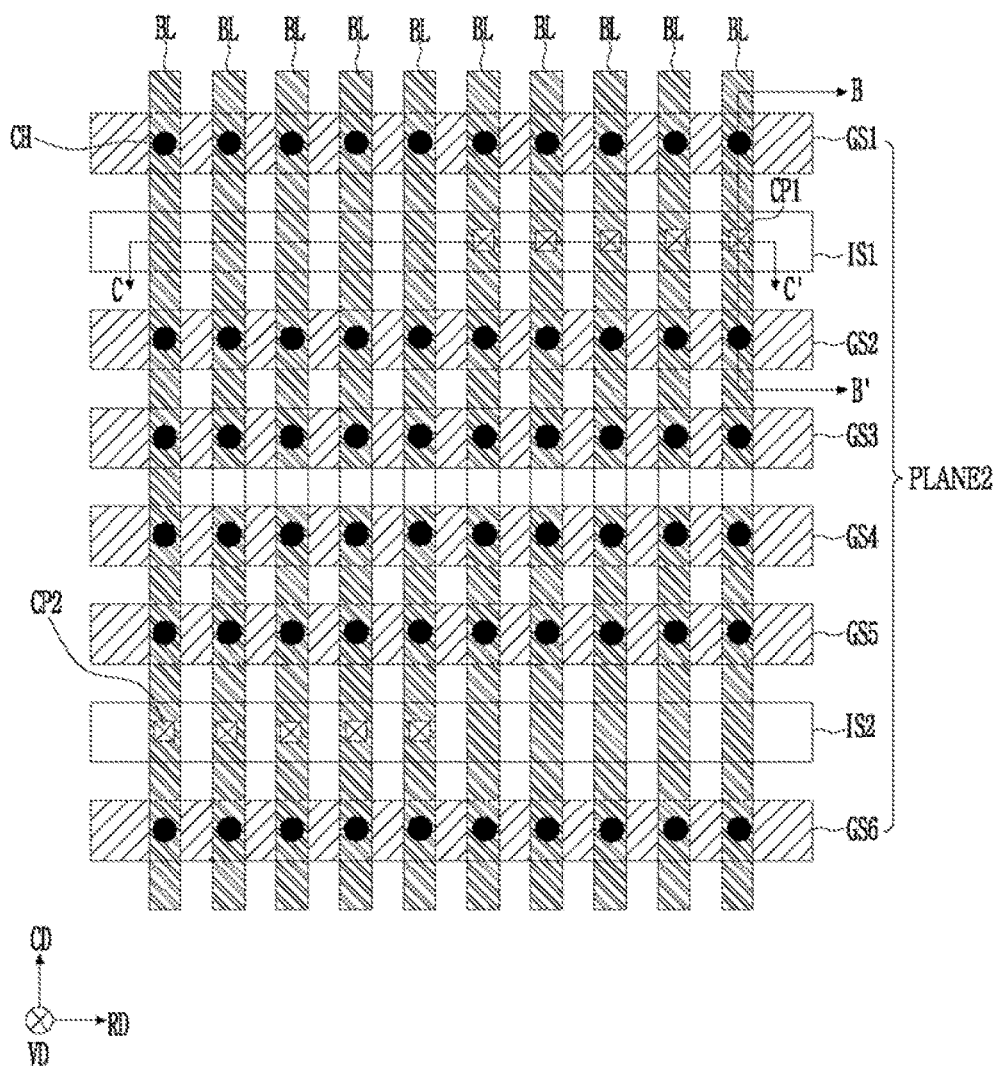
Figure 8:
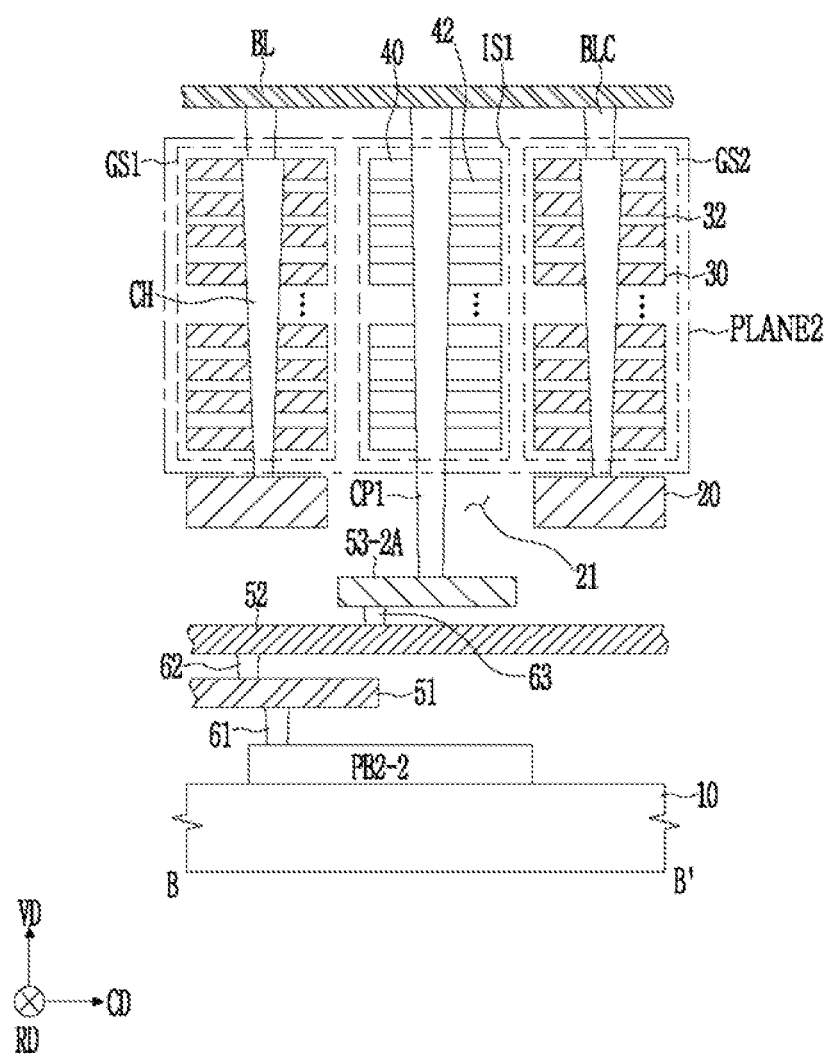
FIG. 8 is a cross-sectional view taken along line B-B' of FIG. 7.
Figure 9:
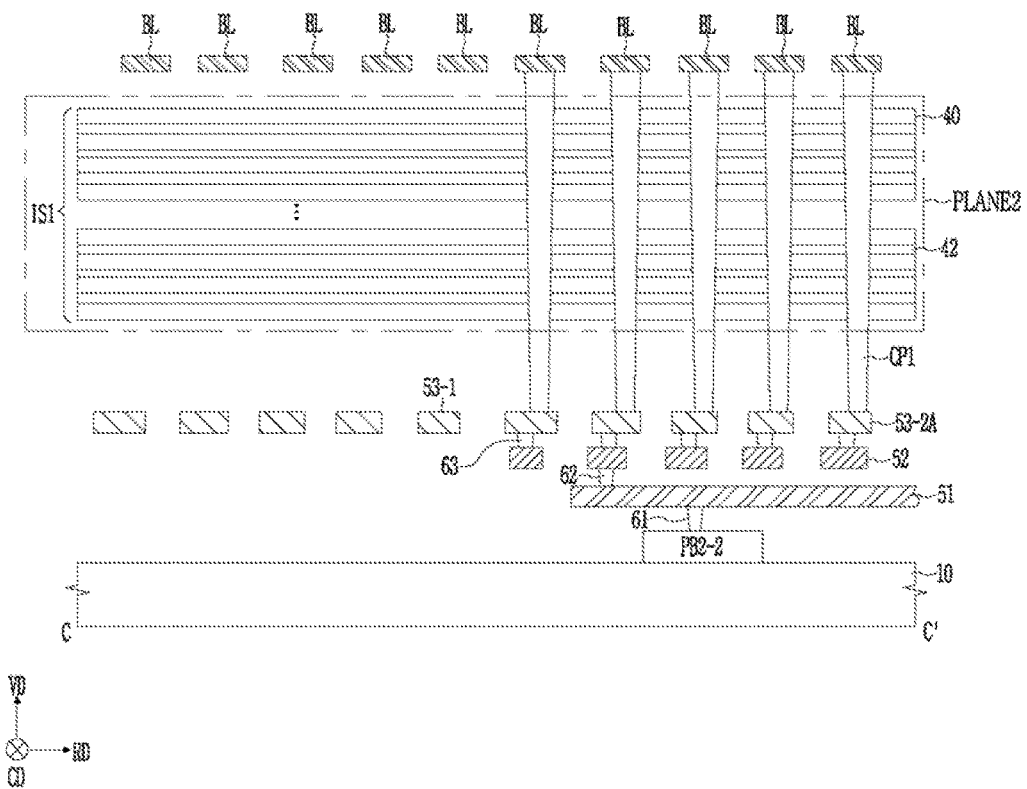
FIG. 9 is a cross-sectional view taken along line C-C' of FIG. 7.

FIGS. 6 and 7 are enlarged plan views illustrating a portion A in FIG. 5, FIG. 8 is a cross-sectional view taken along the line B-B' of FIG. 7, and FIG. 9 is a cross-sectional view taken along the line C-C' of FIG. 7.

The first to fourth planes PLANE1 to PLANE4 may be substantially identical. The first to fourth page buffer circuits PB1-1 to PB4-2 may be substantially identical. For the sake of convenience in explanation, the following descriptions will be made for only the second plane PLANE2 and the sub-page buffer circuit PB2-2 included in the second page buffer circuit. Since the sub-page buffer circuit PB2-2 is a component included in the second page buffer circuit, in the following descriptions, for the sake of convenience in explanation, the component designated by the reference symbol PB2-2 will be referred to as a second page buffer circuit.

For the sake of simplification in illustration, only a third bottom wiring layer including features 53-1, 53-2A and 53-2B and the second plane PLANE2 are illustrated in FIG. 6, and only the second plane PLANE2 and bit lines BL are illustrated in FIG. 7.

Referring to FIGS. 6 to 9, the second page buffer circuit PB2-2 may be disposed on the substrate 10.

The second plane PLANE2 may be disposed over the second page buffer circuit PB2-2. A semiconductor layer 20 which has openings 21 may be disposed between the second page buffer circuit PB2-2 and the second plane PLANE2. More specifically the semiconductor layer 20 may be disposed between the third bottom wiring layer and the second plane PLANE2, as better seen in FIG. 8. The second plane PLANE2 may include a plurality of cell gate lines GS1 to GS6 each of which is stacked on the semiconductor layer 20 as better seen in FIG. 8. Hereafter, for the sake of convenience in explanation, the cell gate lines GS1 to GS6 will be defined as first to sixth cell gate lines GS1 to GS6.

The first to sixth cell gate lines GS1 to GS6 may extend in the first direction RD, and may be arranged along the second direction CD.

Each of the first to sixth cell gate lines GS1 to GS6 may include cell gate conductive layers 30 which are stacked on the semiconductor layer 20 and are separated from one another (FIG. 8). Among the cell gate conductive layers 30, at least one lowermost layer may be used as the select line of a source select transistor, at least one uppermost layer may be used as the select line of a drain select transistor, and conductive layers between the select lines may be used as the word lines of memory cells. While not shown, first dielectric layers 32 may be disposed between the cell gate conductive layers 30 and between the semiconductor layer 20 and the lowermost layer of the cell gate conductive layers 30. That is to say, the cell gate conductive layers 30 and the first dielectric layers 32 may be stacked alternately.

The second plane PLANE2 may include at least two dielectric lines IS1 and IS2 which are disposed between the cell gate lines GS1 to GS6. The dielectric lines IS1 and IS2 are separated from each other in the second direction CD. In the illustrated embodiment, the dielectric line IS1 is disposed between cell gate lines GS1 and GS2 and the dielectric line IS2 is disposed between cell gate lines GS5 and GS6.

Each of the dielectric lines IS1 and IS2 may include second dielectric layers 40 and third dielectric layers 42 which are stacked alternately. The second dielectric layers 40 may be disposed on the same planes as the cell gate conductive layers 30, and the third dielectric layers 42 may be disposed on the same planes as the first dielectric layers 32. The second dielectric layers 40 and the third dielectric layers 42 may have different etching selectivities. For example, the third dielectric layers 42 may be formed of a silicon oxide, and the second dielectric layers 40 may be formed of a silicon nitride.

The first and second dielectric lines IS1 and IS2 may overlap with the openings 21 of the semiconductor layer 20. On the semiconductor layer 20, vertical channel layers CH which pass through the cell gate lines GS1 to GS6 and are electrically coupled to the semiconductor layer 20 may be formed. The vertical channel layers CH may include a polysilicon. In an embodiment, the polysilicon may be doped with an impurity. In another embodiment, the polysilicon may not be doped with an impurity.

Select transistors may be formed where the select lines and the vertical channel layers CH intersect with each other, and memory cells may be formed where the word lines and the vertical channel layers CH intersect with each other. By such a structure, cell strings may be formed including select transistors and a plurality of memory cells coupled in series between the select transistors by the vertical channel layers CH.

A gate dielectric layer (not shown) which surrounds the outer walls of the vertical channel layers CH may be formed between the vertical channel layers CH and the cell gate lines GS1 to GS6. The gate dielectric layer may include a tunnel dielectric layer, a charge storage layer, and a blocking dielectric layer. The tunnel dielectric layer may include a silicon oxide, a hafnium oxide, an aluminum oxide, a zirconium oxide or a tantalum oxide. The charge storage layer may include a silicon nitride, a boron nitride, a silicon boron nitride or a polysilicon doped with an impurity. The blocking dielectric layer may include a single layer or a stacked layer formed of at least one among a silicon oxide, a silicon nitride, a hafnium oxide, an aluminum oxide, a zirconium oxide and a tantalum oxide.

A plurality of bit lines BL which extend in the second direction CD may be disposed over the second plane PLANE2. The bit lines BL may be spaced apart at a regular interval along the first direction RD over the entire region of the substrate 10. The bit lines BL may be electrically coupled to the vertical channel layers CH through bit line contacts BLC.

A plurality of bottom wiring layers including features 51, 52, 53-1, 53-2A and 53-2B may be formed between the second page buffer circuit PB2-2 and the semiconductor layer 20. The bottom wiring layers may be disposed at different layers. For example, the bottom wiring layers may include a first bottom wiring layer 51 disposed lowermost, a third bottom wiring layer including routing lines 53-1, and contact pads 53-2A/53-2B disposed uppermost, and a second bottom wiring layer 52 disposed between the first bottom wiring layer 51 and the third bottom wiring layer.

The routing lines 53-1 electrically couple the cache buffers and the peripheral circuit may be disposed in at least one among the first to third bottom wiring layers. In the embodiment described with reference to the drawings, it is illustrated that the muting lines 53-1 are disposed in the third bottom wiring layer.

The contact pads 53-2A and 53-2B may electrically couple the second page buffer circuit PB2-2 and the bit lines BL, and correspond to the bit lines BL, respectively. The contact pads 53-2A and 53-2B may overlap with corresponding bit lines BL, respectively.

The contact pads 53-2A and 53-2B may be disposed as to be distributed with respect to at least two dielectric lines (e.g., IS1 and IS2) spaced apart along the second direction CD.

The first contact pads 53-2A and the second contact pads 53-2B may be disposed to overlap with the at least two dielectric lines. For example, as illustrated in FIG. 6, the first contact pads 53-2A may overlap with the first dielectric line IS1, and the second contact pads 53-2B may overlap with the second dielectric line IS2.

The first and second contact pads 53-2A and 53-2B may be electrically coupled to corresponding bit lines BL through contact plugs CP1 and CP2 extending in the third direction VD. The contact plugs CP1 and CP2 may include first contact plugs CP1 and second contact plugs CP2. The first contact plugs CP1 may pass through the first dielectric line IS1 in the third direction VD at a region where the first contact pads 53-2A and the corresponding bit lines BL overlap with each other, and electrically couple the first contact pads 53-2A and the corresponding bit lines BL. The first contact plugs CP1 may pass through the openings 21 of the semiconductor layer 20 which overlap with the first dielectric line IS1.

The second contact plugs CP2 may pass through the second dielectric line IS2 in the third direction VD at a region where the second contact pads 53-2B and the corresponding bit lines BL overlap with each other, and electrically couple the second contact pads 53-2B and the corresponding bit lines BL. The second contact plugs CP2 may pass through the openings 21 of the semiconductor layer 20 which overlap with the second dielectric line IS2.

The second page buffer circuit PB2-2 may be electrically coupled to a corresponding one of the first and second contact pads 53-2A and 53-2B through first bottom wiring contacts 61, the first bottom wiring layer 51, second bottom wiring contacts 62, the second bottom wiring layer 52 and third bottom wiring contacts 63.

The first bottom wiring layer 51 may be electrically coupled to the second page buffer circuit PB2-2 through the first bottom wiring contacts 61. The first bottom wiring contacts 61 may extend in the third direction VD, and electrically couple the second page buffer circuit PB2-2 and the first bottom wiring layer 51. The second bottom wiring layer 52 may be electrically coupled to the first bottom wiring layer 51 through the second bottom wiring contacts 62. The second bottom wiring contacts 62 may extend in the third direction VD, and electrically couple the first bottom wiring layer 51 and the second bottom wiring layer 52. The first and second contact pads 53-2A and 53-2B may be electrically coupled to the second bottom wiring layer 52 through the third bottom wiring contacts 63. The third bottom wiring contacts 63 may extend in the third direction VD, and electrically couple the second bottom wiring layer 52 and the first and second contact pads 53-2A and 53-2B.

The routing lines 53-1 may be formed in a bent pattern illustrated in FIG. 6 to pass between the first contact pads 53-2A and the second contact pads 53-2B which are disposed to overlap with different dielectric lines IS1 and IS2, respectively.

If we assume for the sake of argument, that, unlike the illustrated embodiment, all the contact pads 53-2A and 53-2B are disposed to overlap with the same dielectric line then, the space available for disposing the routing lines may be decreased substantially. This is because it is difficult to secure sufficient space in the first direction RD, due to the presence of the contact pads 53-2A and 53-2B in the same line. Hence, it may be impossible to dispose appropriately the needed routing lines 53-1 or stated otherwise the number of the routing lines 53-1 that can be disposed may be limited substantially. Therefore, signal routing between cache buffers and a peripheral circuit may be limited due to the limited number of routing lines that can be accommodated, and this may in turn lead to a reduction in data processing amount and a decrease in operation speed. The present invention, inter alia, overcomes these limitations.

In the illustrated embodiment, because more space for disposing the routing lines 53-1 may be secured by disposing the contact pads 53-2A and 53-2B in a distributed manner to overlap with at least two dielectric lines, an increased number of routing lines 53-1 electrically coupling the cache buffers and the peripheral circuit may be secured sufficiently. Therefore, a larger amount of signal routing between the cache buffers and the peripheral circuit may become possible, and thus, it is possible to increase the amount of data being processed and the operation speed.

The embodiments described heretofore with reference to FIGS. 1 to 9 illustrate the case where planes included in a memory cell array are arranged in only the second direction CD. However, it is to be noted that the invention is not limited thereto.

Planes included in a memory cell array may be arranged by at least two in each of the first direction RD and the second direction CD. Such an embodiment will become apparent from the following descriptions to be made with reference to FIG. 10.

Figure 10:
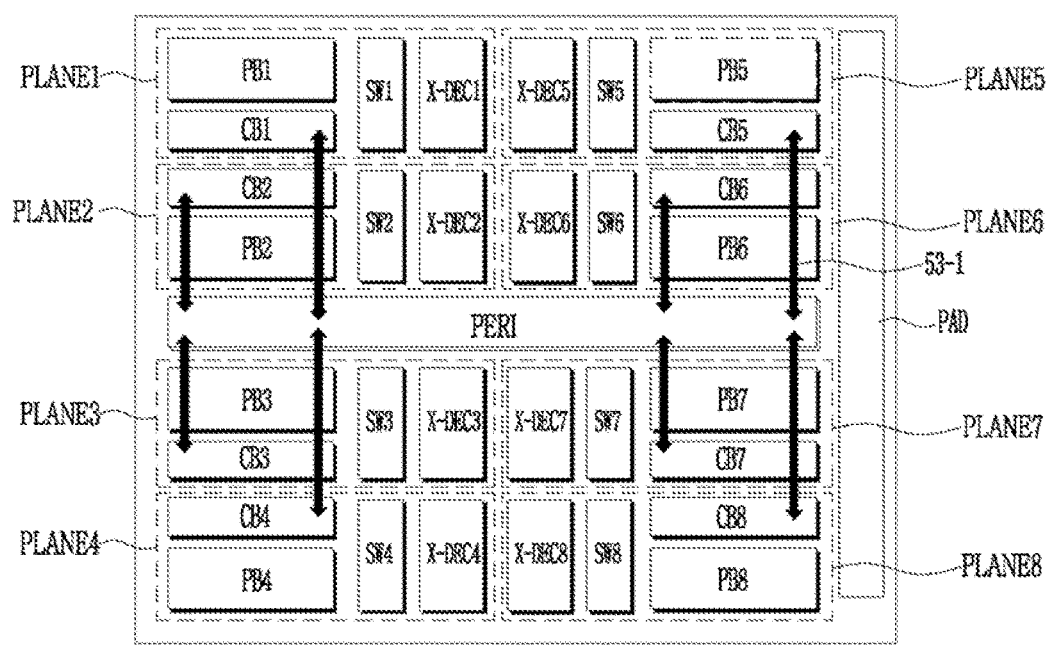
FIG. 10 is a plan view illustrating a nonvolatile memory device in accordance with an embodiment of the invention.
Figure 10:
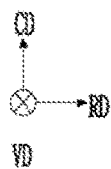

FIG. 10 is a plan view illustrating a nonvolatile memory device in accordance with an embodiment.

A memory cell array may include a first group of first to fourth planes PLANE1 to PLANE4 which are spaced apart along the second direction CD and a second group of fifth to eighth planes PLANE5 to PLANE8 which are spaced apart along the second direction CD.

The first and second groups of planes may be spaced apart along a first direction RD. In other words, the memory cell array may include the first to eighth planes PLANE1 to PLANE8 which are disposed in a 2×4 matrix structure along the first direction RD and the second direction CD.

Under the first to eighth planes PLANE1 to PLANE8, there may be disposed first to eighth row decoders X-DEC1 to X-DEC8, first to eighth switch circuits SW1 to SW8, first to eighth page buffer circuits PB1 to PB8, and first to eighth cache buffers CB1 to CB8. A peripheral circuit PERI extending in the first direction RD may be disposed on the substrate (not shown). As viewed from the top the peripheral circuit may be disposed centrally between planes PLANE2 and PLANE3 and planes PLANE6 and PLANE7.

The first to eighth row decoders X-DEC1 to X-DEC8 may correspond to the first to eighth planes PLANE1 to PLANE8, respectively. The first to eighth switch circuits SW1 to SW8 may correspond to the first to eighth planes PLANE1 to PLANE8, respectively. The first to eighth page buffer circuits PB1 to PB8 may correspond to the first to eighth planes PLANE1 to PLANE8, respectively. The first to eighth cache buffers CB1 to CB8 may correspond to the first to eighth planes PLANE1 to PLANE8, respectively.

Each of the first to eighth planes PLANE1 to PLANE8 may overlap with a row decoder X-DEC, a switch circuit SW, a page buffer circuit PB and a cache buffer CB corresponding thereto. A page buffer circuit PB and a cache buffer CB corresponding to the same plane may be disposed adjacent to each other in the second direction CD.

Each of the first to eighth switch circuits SW1 to SW8 may be disposed adjacent to a page buffer circuit PB and a cache buffer CB corresponding to the same plane therewith, in the first direction RD. Each of the first to eighth row decoders X-DEC1 to X-DEC8 may be disposed adjacent to a page buffer circuit PB and a cache buffer CB corresponding to the same plane therewith, with a switch circuit SW interposed therebetween, in the first direction RD.

The peripheral circuit PERI may extend in the first direction RD in an elongated rectangular form that is coextensive in the first direction with the total length of the planes in the first direction.

As viewed from the top, the first to fourth page buffer circuits PB1 to PB4, the first to fourth cache buffers CB1 to CB4 and the peripheral circuit PERI may be arranged along the second direction CD, and configure a first column. The fifth to eighth page buffer circuits PB5 to PB8, the fifth to eighth cache buffers CB5 to CB8 and the peripheral circuit PERI may be arranged along the second direction CD, and configure a second column.

Between the first to eighth cache buffers CB1 to CB8 and the peripheral circuit PERI, there may be disposed as least one page buffer circuit. For example, the second page buffer circuit PB2 may be disposed between the first and second cache buffers CB1 and CB2 and the peripheral circuit PERI, the third page buffer circuit PB3 may be disposed between the third and fourth cache buffers CB3 and CB4 and the peripheral circuit PERI, the sixth page buffer circuit PB6 may be disposed between the fifth and sixth cache buffers CB5 and CB6 and the peripheral circuit PERI, and the seventh page buffer circuit PB7 may be disposed between the seventh and eighth cache buffers CB7 and CB8 and the peripheral circuit PERI.

The first to eighth cache buffers CB1 to CB8 and the peripheral circuit PERI may be electrically coupled through a plurality of routing lines 53-1. The routing lines 53-1 and structures associated therewith are substantially the same as in the embodiment described above with reference to FIGS. 4 to 9. Thus, repeated descriptions for the same configuration will be omitted herein.

Figure 11:
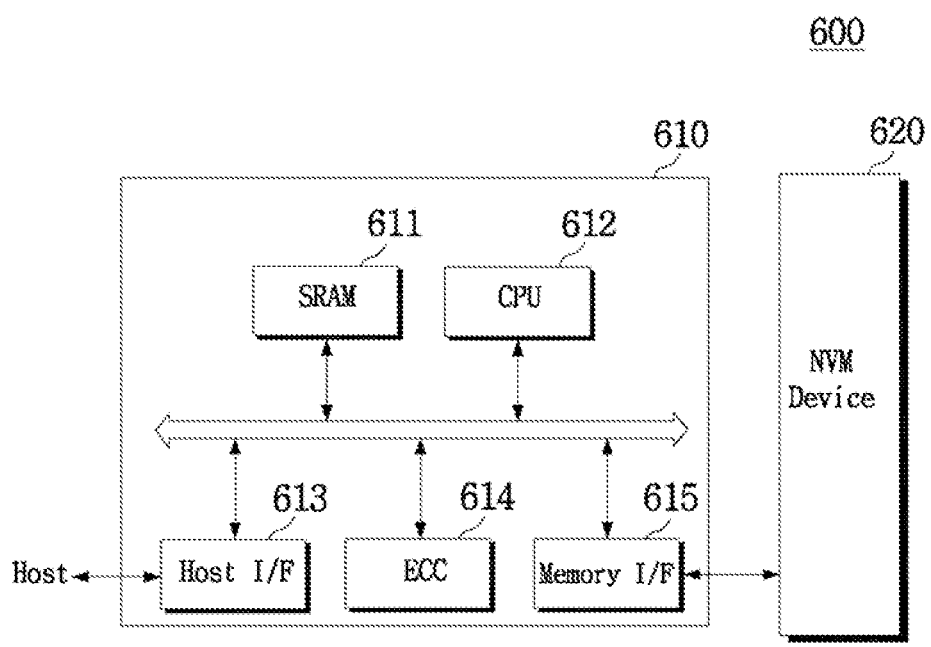
FIG. 11 is a simplified block diagram schematically illustrating a memory system including a nonvolatile memory device, according to an embodiment of the invention.

FIG. 11 is a simplified block diagram schematically illustrating a memory system 600 including a nonvolatile memory device 620, according to an embodiment of the present invention.

Referring to FIG. 11, the memory system 600 may include a memory controller 610 and the nonvolatile memory device 620.

The nonvolatile memory device 620 may be constructed and operated according to an embodiment of the invention as described above. The memory controller 610 may control the nonvolatile memory device 620. For example, the combination of the nonvolatile memory device 620 and the memory controller 610, may be configured as a memory card or a solid state drive/disk (SSD).

The memory controller 610 may include a static random access memory (SRAM) 611, a central processing unit (CPU) 612, a host interface (I/F) 613, an error correction code (ECC) unit 614, and a memory interface 615, which are electrically coupled via an internal bus. The SRAM 611 may be used as the working memory of the CPU 612. The CPU 612 may perform general control operations for data exchange of the memory controller 610. The host interface 613 may include the data exchange protocol of a host which may be coupled with the memory system 600.

The ECC unit 614 may detect and correct an error included in the data read out from the nonvolatile memory device 620.

The memory interface 615 may interface with the nonvolatile memory device 620.

Although not shown, it should become apparent to a person skilled in the art that the memory system 600 may further be provided with a read only memory (ROM) which stores code data for interfacing with the host. The nonvolatile memory device 620 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state drive/disk (SSD). The memory controller 610 may communicate with an external device (for example, the host) through one of various interface protocols such as a universal serial bus (USB) protocol, a multimedia card (MMC) protocol, a peripheral component interconnection express (PCI-E) protocol, a serial advanced technology attachment (SATA) protocol, a parallel advanced technology attachment (PATA) protocol, a small computer system interface (SCSI) protocol, an enhanced small disk interface (ESDI) protocol and an integrated device electronics (IDE) protocol and the like.

Figure 12:
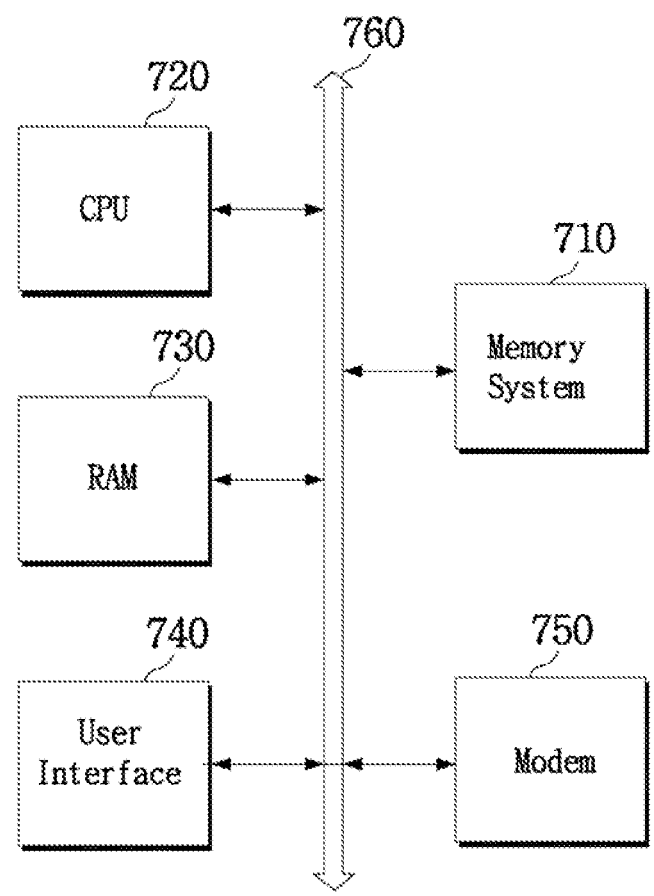
FIG. 12 is a simplified block diagram schematically illustrating a computing system including a nonvolatile memory device, according to an embodiment of the invention.

FIG. 12 is a simplified block diagram schematically illustrating a computing system 700 including a nonvolatile memory device, according to an embodiment of the present invention.

Referring to FIG. 12, the computing system 700 may include a memory system 710, a microprocessor (or CPU) 720, a random access memory (RAM) 730, a user interface 740, and a modem 750 such as a baseband chipset, which are electrically coupled via a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a complementary metal-oxide-semiconductor (CMOS) image sensor (CIS), a mobile dynamic random access memory (DRAM), and so on. The memory system 710 may be configured, for example, as a solid state drive/disk (SSD) which uses a nonvolatile memory to store data. Also as an example, the memory system 710 may be provided as a fusion flash memory (for example, a NAND or a NOR flash memory).

The above-described embodiments may be realized by a device and a method. They may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A nonvolatile memory device comprising:
   a plurality of bit lines arranged in a first direction over a substrate;
   a memory cell array including a plurality of planes arranged in a second direction perpendicular to the first direction, the memory cell array disposed between the substrate and the bit lines in a third direction orthogonal to the first and second directions;
   page buffer circuits disposed between the substrate and the memory cell array in the third direction;
   contact pads disposed between the substrate and the memory cell array in the third direction, the contact pads being suitable for electrically coupling the bit lines and the page buffer circuits; and
   routing lines disposed at the same layer as the contact pads, the routing lines extending in the second direction,
   wherein the contact pads are disposed to overlap with at least two lines which are arranged in the second direction, and the routing lines are formed in a bent pattern to pass between the contact pads which are disposed to overlap with different lines.

2. The nonvolatile memory device according to claim 1, wherein the contact pads correspond to the bit lines, respectively, and overlap with corresponding bit lines, respectively.

3. The nonvolatile memory device according to claim 1, further comprising:
   a peripheral circuit disposed between the substrate and the memory cell array, and arranged side by side with the page buffer circuits in the second direction; and
   cache buffers disposed between the substrate and the memory cell array, arranged side by side with the page buffer circuits and the peripheral circuit in the second direction, and electrically coupled with the peripheral circuit through the routing lines.

4. The nonvolatile memory device according to claim 3, wherein each of the cache buffers is disposed adjacent to the peripheral circuit in the second direction with at least one page buffer interposed therebetween.

5. The nonvolatile memory device according to claim 3,
   wherein the page buffer circuits correspond to the planes, respectively,
   wherein the cache buffers correspond to the planes, respectively, and
   wherein each of the cache buffers is disposed adjacent to a page buffer circuit corresponding to the same plane with itself, in the second direction.

6. The nonvolatile memory device according to claim 5, further comprising:
   switch circuits corresponding to the planes, respectively, and electrically coupled to corresponding planes, respectively, through word line and select lines; and
   row decoders corresponding to the planes, respectively, and electrically coupled to corresponding planes, respectively, through switch circuits corresponding to the same planes with themselves.

7. The nonvolatile memory device according to claim 6,
   wherein each of the page buffer circuits comprises two sub-page buffer circuits which are physically separated from each other, and
   wherein the sub-page buffer circuits included in each of the page buffer circuits are disposed adjacent to each other in the first direction with a switch circuit and a row decoder corresponding to the same plane with themselves, disposed therebetween.

8. The nonvolatile memory device according to claim 6,
   wherein each of the cache buffers comprises two sub-cache buffers which are physically separated from each other, and
   wherein the sub-cache buffers included in each of the cache buffers are disposed themselves each other in the first direction with a switch circuit and a row decoder corresponding to the same plane with themselves, disposed therebetween.

9. The nonvolatile memory device according to claim 3,
   wherein the peripheral circuit comprises:
   an input/output circuit suitable for transferring input data to the cache buffers or transferring output data from the cache buffers to an exterior;
   a control logic suitable for generating cache input/output control signals; and
   a column decoder suitable for generating a column decoding signal.

10. The nonvolatile memory device according to claim 9,
    wherein the routing lines comprise:
    data lines electrically coupled between the input/output circuit and the cache buffers, and suitable for transferring the input data and the output data;
    cache input/output control signal lines electrically coupled between the control logic and the cache buffers, and suitable for transferring the cache input/output control signals to the cache buffers; and
    column decoding signal lines electrically coupled between the column decoder and the cache buffers, and suitable for transferring the column decoding signal to the cache buffers.

11. A nonvolatile memory device comprising:
    a plurality of bit lines arranged in a first direction over a substrate;
    a memory cell array including a plurality of cell gate lines and a plurality of dielectric lines which are arranged in a second direction perpendicular to the first direction, the memory cell array disposed between the substrate and the bit lines in a third direction orthogonal to the first and second directions;
    a page buffer circuit disposed between the substrate and the memory cell array in the third direction;
    contact pads disposed between the page buffer circuit and the memory cell array in the third direction, and suitable for electrically coupling the page buffer circuit and the bit lines; and
    routing lines disposed at the same layer as the contact pads, and extending in the second direction,
    wherein the contact pads are disposed to overlap with at least two of the dielectric lines, and
    wherein the routing lines are formed in a bent pattern to pass between the contact pads which overlap with different dielectric lines.

12. The nonvolatile memory device according to claim 11,
    wherein each of the cell gate lines comprises cell gate conductive layers and first dielectric layers which are stacked alternately, and
    wherein each of the dielectric lines comprises second dielectric layers and third dielectric layers which are stacked alternately.

13. The nonvolatile memory device according to claim 11, further comprising:
    contact plugs passing through the dielectric lines in a third direction that is orthogonal to the first direction and the second direction, and suitable for electrically coupling the contact pads and the bit lines.

14. The nonvolatile memory device according to claim 13, further comprising:
- a semiconductor layer disposed between the memory cell array and the contact pads; and
- vertical channel layers passing through the cell gate lines in the third direction, and electrically coupled with the semiconductor layer.

15. The nonvolatile memory device according to claim 14, wherein the semiconductor layer includes openings which overlap with the dielectric lines and through which the contact plugs pass.

16. A nonvolatile memory device comprising:
- a plurality of bit lines arranged in a first direction over a substrate;
- a memory cell array including a plurality of planes which are arranged in the first direction and a second direction perpendicular to the first direction, the memory cell array disposed between the substrate and the bit lines in a third direction orthogonal to the first and second directions;
- page buffer circuits disposed between the substrate and the memory cell array in the third direction;
- contact pads disposed between the page buffer circuits and the memory cell array in the third direction, and suitable for electrically coupling the bit lines and the page buffer circuits; and
- routing lines disposed at the same layer as the contact pads, and extending in the second direction,
- wherein the contact pads are disposed to overlap with at least two lines which are arranged in the second direction, and
- wherein the routing lines are formed in a bent pattern to pass between the contact pads which are disposed to overlap with different lines.

17. The nonvolatile memory device according to claim 16,
- wherein the page buffer circuits correspond to the planes, respectively, and
- wherein each of the page buffer circuits is disposed below a corresponding plane.

18. The nonvolatile memory device according to claim 17, further comprising:
- a peripheral circuit disposed between the substrate and the memory cell array, and arranged side by side with the page buffer circuits in the second direction; and
- cache buffers disposed between the substrate and the memory cell array, arranged side by side with the page buffer circuits and the peripheral circuit in the second direction, and electrically coupled with the peripheral circuit through the routing lines.

19. The nonvolatile memory device according to claim 18,
- wherein the cache buffers correspond to the planes, respectively, and
- wherein each of the cache buffers is disposed adjacent to a page buffer circuit corresponding to the same plane with itself, in the second direction.

20. The nonvolatile memory device according to claim 19, further comprising:
- switch circuits corresponding to the planes, respectively, and electrically coupled to corresponding planes, respectively, through select lines; and
- row decoders corresponding to the planes, respectively, and electrically coupled to corresponding planes, respectively, through switch circuits corresponding to the same planes with themselves,
- wherein each of the switch circuits is disposed adjacent to a page buffer circuit and a cache buffer corresponding to the same plane with itself, in the first direction, and
- wherein each of the row decoders is disposed adjacent to a page buffer circuit and a cache buffer corresponding to the same plane with itself, in the first direction, with a switch circuit interposed therebetween.

\* \* \* \* \*